United States Patent [19]

Alvarez, Jr.

[11] 3,961,269

[45] June 1, 1976

[54] MULTIPLE PHASE CLOCK GENERATOR

[75] Inventor: Cesar E. Alvarez, Jr., Griffith, Ind.

[73] Assignee: Teletype Corporation, Skokie, Ill.

[22] Filed: May 22, 1975

[21] Appl. No.: 579,759

[52] U.S. Cl. .................................. 328/62; 307/262; 331/45; 331/60
[51] Int. Cl.² ...................... H03K 1/00; H03K 3/04; H03B 27/00
[58] Field of Search ............... 307/262; 328/57, 62; 331/45, 60, 61

[56] References Cited
UNITED STATES PATENTS

| | | | |
|---|---|---|---|
| 3,292,100 | 12/1966 | Berlind | 331/45 |
| 3,441,751 | 4/1969 | Benedict | 328/62 |
| 3,590,280 | 6/1971 | Hudson et al. | 328/62 |
| 3,648,181 | 3/1972 | Fiore et al. | 307/262 |
| 3,668,436 | 6/1972 | Bacon | 307/262 |
| 3,735,277 | 5/1973 | Wanlass | 331/45 |
| 3,740,660 | 6/1973 | Davies, Jr. | 331/45 |

*Primary Examiner*—Stanley D. Miller, Jr.
*Attorney, Agent, or Firm*—D. L. Hurewitz; J. L. Landis

[57] ABSTRACT

A two phase clock signal with separation between the two phases is produced from a single phase clock. Two complementary input signals are derived from the single phase clock and are transferred by separate transfer gates to individual push/pull amplifiers. Each gated input signal is applied to the first input of one of the amplifiers while the complementary input signals are connected directly to the second input of the amplifiers. The output of each push/pull amplifier is one of the clock phases, and each is also applied to a sensing circuit. The sensing circuit produces delayed outputs which are cross-coupled to control the transfer gate associated with the other output phase. By judicious selection of the parameters of the sensing circuit, the time and speed of "turn-on" for each transfer gate can be controlled. Accordingly, the separation between the two clock phases as well as the shape of each can be selected.

18 Claims, 5 Drawing Figures

MULTIPLE PHASE CLOCK GENERATOR

BACKGROUND OF THE INVENTION

This invention relates to electronic timing circuits and particularly to multiple phase clock signal generators. More specifically, it relates to such generators which provide adjustable spacing between the multiple phase clock signals.

Electronic logic circuits require accurate timing information and in many applications a number of clock signals having interdependent relationships are necessary. As it has been found generally preferable to derive these multiple clock signals, or multiple phase clock signals, from a common source, clock circuits have been designed to operate upon a single clock input (generated by an external or internal oscillator) to produce therefrom the multiple clock signals having the desired phasal relationship.

The prior art is replete with multiple phase clock circuits. For example, in U.S. Pat. No. 3,735,277, issued May 22, 1973, to Mr. F. M. Wanlass, two-bit shift registers are used to provide four distinct and overlapping clock pulses. In many cases, however, it is desirable to have multiple phase clock signals which do not overlap in time. One such circuit, which provides nonoverlapping multiple phase clock signals, is shown in U.S. Pat. No. 3,668,436, issued June 6, 1972, to S. H. Bacon. In that circuit a pair of complementary logic signals is provided by an oscillator. One signal is gated to each of two amplifiers and the output of each amplifier is used to directly control the gating to the other amplifier. The gating is arranged so that an output from one amplifier is prevented by grounding its input whenever the other amplifier is producing an output. Hence, the amplifier which would normally begin to operate (or turn ON) is maintained in an OFF state as long as the gating signal from the other amplifier causes its input to be grounded. This arrangement prevents simultaneous production of clock pulses from both amplifiers and therefore insures that no significant overlap will occur between the multiple phase output signals. However, it does not provide separation between the phases, and a defined spacing between clock phases is, of course, useful in many applications. In addition, an inherent effect of grounding the input is to create a large power dissipation when the amplifier is maintained OFF, and since reduced power consumption is a generally desirable goal, this is an unattractive aspect of the circuit.

Accordingly, it is an objective of the present invention to provide an improved multiple phase clock circuit.

It is a particular object of the invention to provide a multiple phase clock circuit which produces multiple clock phases separated by defined and selectable time intervals.

It is also an object of the invention to provide a multiple phase circuit which avoids unnecessary power dissipation.

It is a further object to provide a multiple phase clock circuit which permits control of the rise and fall characteristics of the multiple clock phases.

It is an additional object to provide a multiple phase clock circuit which provides more than two clock phases.

SUMMARY OF THE INVENTION

In accordance with the invention, a two-phase output clock signal with separation between the two phases is produced from a single phase clock pulse train provided by an oscillator source. Two complementary input signals are derived from this single phase clock pulse train and are transferred via separate transfer gates to individual push/pull amplifiers. The gated input signals are applied to a first input of each amplifier and the complementary input signals are connected directly to the second inputs. The output of each push/pull amplifier is a bilevel pulse train which is one of the output clock phases.

At least one amplifier output is also applied to a sensing circuit, which introduces a defined delay, and the delayed output from the sensing circuit is cross-coupled to control the transfer gate associated with the other output phase. By judicious selection of the parameters of the sensing circuit, the time and speed of "turn-ON" for the transfer gate can be controlled. Accordingly, the time between one phase and the other can be controlled. Where two sensing circuits are used the separation between the pulses of the two clock phases, as well as the shape of each pulse, can be selected.

The double coupling to each amplifier in conjunction with the transfer gates avoids the power dissipation common in the prior art, since the amplifiers are normally OFF and the cross-coupled gate control is used to turn the amplifier ON only when the clock phase is to be produced.

The multiple phase clock generator can be embodied using any appropriate fabrication technique. In addition the transfer gates, double-coupled amplifiers and sensing circuits can be provided by numerous current configurations. As an example circuits using metal-oxide-semiconductor-field-effect transistors, hereinafter referred to as MOSFETs, is shown. In one particular embodiment, the sensing circuits consist of a series of bootstrap inverters; each transfer gate is simply a single MOSFET with a cross-coupled feedback signal applied from the other sensing circuit to its gate; and the push/pull amplifiers are bootstrap "inverters" with the direct coupled input applied to the gate of the pull-down MOSFET and the input from the transfer gate being applied to the gate of the load or pull-up MOSFET.

Since the spacing between the pulses of the two clock phases can be controlled, the separation between them can be made large enough for the insertion of an additional third clock phase with its pulse occurring during the time both of the two primary phases are OFF; i.e., between pulses. The generation of a third clock phase can be provided simply by the addition of a NOR-gate to detect when the first and second phases are OFF, an inverter to generate the complement of the NOR-gate output, and a push/pull amplifier to produce the third clock phase intermediate to the first two. With appropriate circuitry, spacing for a fourth, fifth, sixth, etc., clock phase can be provided, and thus, theoretically, the space between pulses of any two clock phases can be filled with the pulses of another additional clock phase.

DETAILED DESCRIPTION

Figure 1:
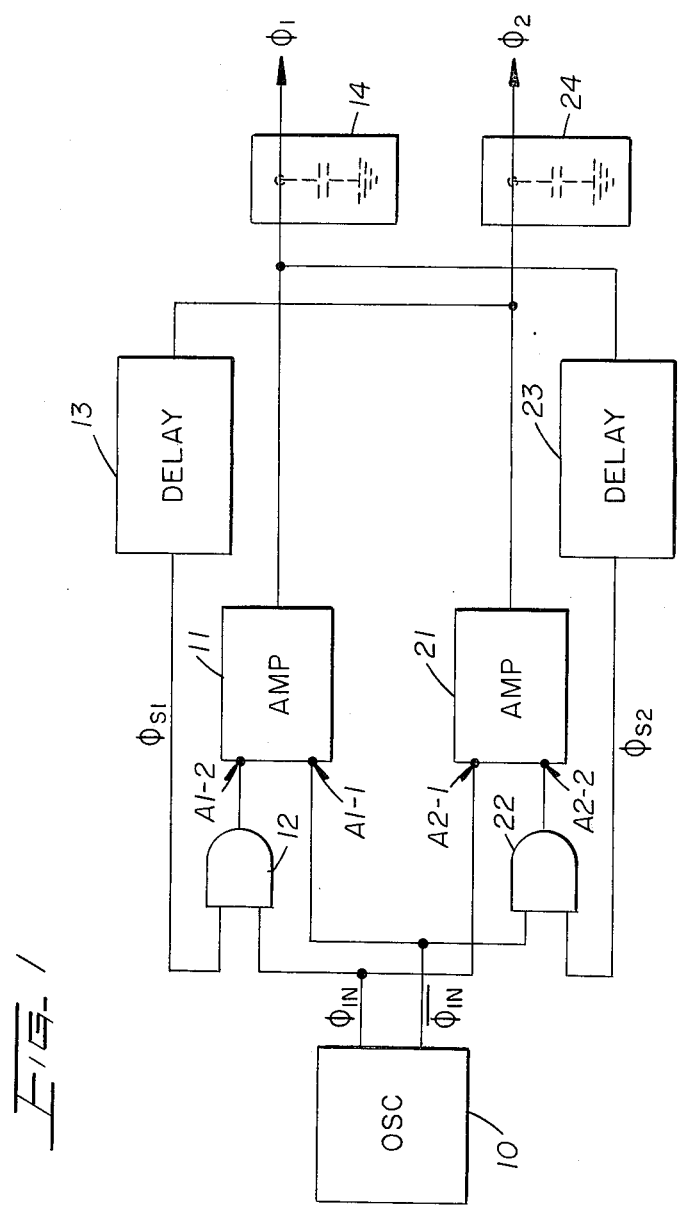
FIG. 1 is a block diagram illustrative of a two phase clock circuit in accordance with the present invention.
Figure 2:
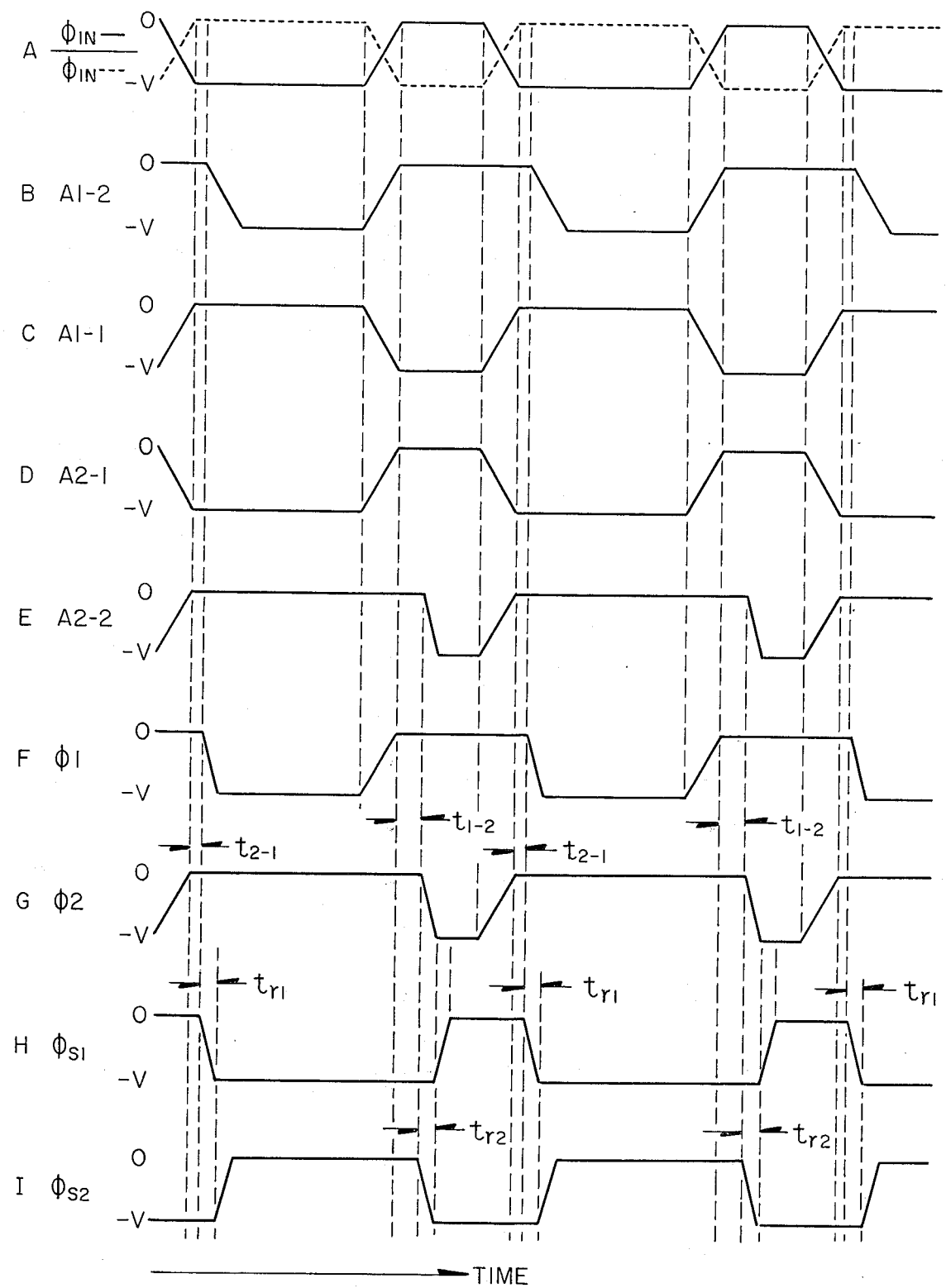
FIG. 2 is a timing diagram illustrative of the operation of the circuit of FIG. 1.

The block diagram of FIG. 1 illustrates the basic elements of a two-phase clock circuit which provides two independently controllable clock phases $\phi_1$ and $\phi_2$ for application to separate loads 14 and 24, respectively, shown, for example, as capacitive loads. An oscillator 10 produces two outputs $\phi_{IN}$ and $\overline{\phi_{IN}}$ which are complementary pulse trains as shown in FIG. 2A. One output of the oscillator 10, $\overline{\phi_{IN}}$, is directly coupled to an input $A_{1-1}$ of a first amplifier 11. This input provides a path to discharge the output, $\phi_1$, of the first amplifier 11 to a low or reference level (no pulse; shown as ground in the timing diagram of FIG. 2F) whenever this input is at a high level, (pulse present; −V in the timing diagram of FIG. 2C). The output, $\phi_1$, of the first amplifier 11 is allowed to rise to the high level only when there exists a high level enable pulse at the other input A1-2 to amplifier 11 (see FIG. 2B). This high level at the A1-2 input is produced by the AND transfer gate 12 only when its inputs (the output $\phi_{S1}$ from a first delay circuit 13 and the other output, $\phi_{IN}$, of oscillator 10) are high. Hence the $\phi_1$ clock pulse is turned ON (pulse begins) when a pulse of the $\phi_{IN}$ output from oscillator 10 is passed to the amplifier 11 in response to a pulse from circuit 13.

The first delay circuit 13 is part of a feedback path from the output of a second amplifier 21 to the transfer gate 12. The input to the first delay circuit 13 is thus the output clock signal $\phi_2$ and this is delayed, and logically inverted to produce a control output $\phi_{S1}$. Thus, a defined interval after $\phi_2$ goes low (ground), the $\phi_{S1}$ control signal exhibits a high level pulse which, when coincident with the high level pulse of the other complementary pulse train $\phi_{IN}$ at the output of the oscillator 10 causes AND transfer gate 12 to produce the enable pulse at the input A1-2 of the first amplifier 11. The amount of the delay and in addition, the rise time of the control signal $\phi_{S1}$ therefore determine the turn-on characteristics of the output clock phase $\phi_1$, and these characteristics can be adjusted by choosing appropriate parameters within the delay circuit 13. The $\phi_1$ clock phase turns OFF (pulse ends) in response to a change in the level of the $\phi_{IN}$ output from oscillator 10 (and hence an equivalent change in the state of the output $\overline{\phi_{IN}}$.

The second half of the circuit includes identical elements and works in the same manner to produce the other clock phase $\phi_2$. The oscillator outputs $\phi_{IN}$ and $\overline{\phi_{IN}}$ are, of course, connected in reverse order to the second amplifier 21 and the gate 22; the feedback to the second delay circuit 23 is the clock pulse $\phi_1$ from the output of the first amplifier 11, instead of the clock phase $\phi_2$; and the control output $\phi_{S2}$ is applied to gate 22. The $\phi_{IN}$ signal applied to one input A2-1 of the amplifier 21 (FIG. 2D) provides a path to discharge clock signal $\phi_2$ to the low level (no pulse shown as ground in FIG. 2G) whenever $\phi_{IN}$ is high. The delayed output of the delay circuit 23 provides a high level pulse ($\phi_{S2}$ in FIG. 2I) a fixed interval after clock phase $\phi_2$ (FIG. 2G) goes low. The coincidence of a high $\phi_{S2}$ signal and a high $\overline{\phi_{IN}}$ signal applied to the AND transfer gate 22 produces a high level pulse at the input A2-2 of the amplifier 21. This, in turn, causes a high state of output clock signal $\phi_2$ at the amplifier output. The characteristics (delay and rise time) of the control signal $\phi_{S2}$ are, of course, adjustable by variation of the parameters within the delay circuit 23.

Thus, a $\phi_2$ pulse (−V in FIG. 2G) is produced only when $\overline{\phi_{IN}}$ is high and coincidentally $\phi_1$ has been low for a defined delay time, designated $t_{1-2}$. Similarly, $\phi_1$ can exhibit a pulse (−V in FIG. 2F) only when $\phi_{IN}$ is high and coincidentally $\phi_2$ (the other output clock) has been low for a defined delay time, designated $t_{2-1}$, which may be different from $t_{1-2}$. Accordingly, the pulses of the two output clock signals $\phi_1$ and $\phi_2$ cannot overlap in time and their spacing can be individually controlled by parameter variations especially in the delay circuits 13 and 23.

In FIGS. 2H and 2I the designations $t_{r1}$ and $t_{r2}$ represent, respectively, the rise time of $\phi_{S1}$ and the rise time of $\phi_{S2}$. Since $\phi_{S1}$ and $\phi_{S2}$, the outputs of the delay circuits 13 and 23, respectively, trigger the rise of the amplifier outputs, the parameters of the delay circuits 13 and 23 control the rise times of the clock signals $\phi_1$ and $\phi_2$, and the rise times of $\phi_1$ and $\phi_2$ are dependent upon $t_{r1}$ and $t_{r2}$, respectively. The fall times of $\phi_1$ and $\phi_2$ are controlled by the input clock signal $\phi_{IN}$ and its complement $\overline{\phi_{IN}}$ and by the parameters of power amplifiers 11 and 21 respectively.

The delay between the end of a $\phi_2$ pulse (when $\phi_2$ reaches ground in FIG. 2G) and the beginning of a $\phi_1$ pulse (when $\phi_1$ starts to go toward −V in FIG. 2F) is designated $t_{2-1}$, and the delay between the fall of $\phi_1$ and the rise of $\phi_2$ is designated $t_{1-2}$, as shown in FIG. 2G and indicated hereinbefore.

Figure 3:
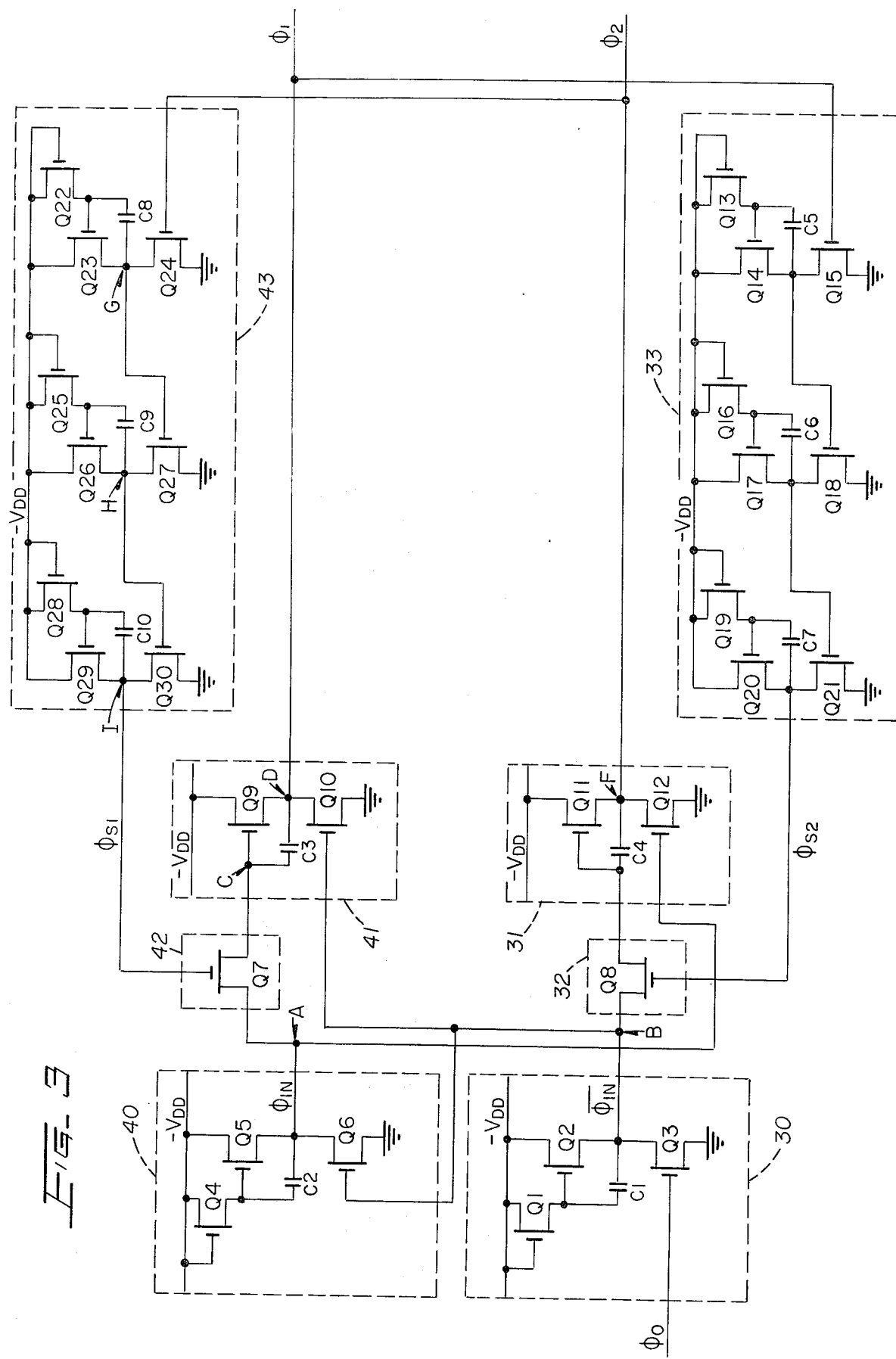
FIG. 3 is a schematic diagram of a multiple phase clock circuit in accordance with the present invention.

While the multiple phase clock circuit can be embodied using numerous alternative technologies, including vacuum tubes, bipolar transistors, etc., FIG. 3 illustrates an embodiment of a two-phase circuit using MOSFETs or field-effect transistors of the metal-oxide-semiconductor type. It is assumed that these are of the p-channel enhancement mode type, but the circuit may also be constructed using other types of MOSFETs, including depletion mode p-channel devices, and n-channel devices of either the enhancement or depletion variety.

The complementary input signals $\phi_{IN}$ and $\overline{\phi_{IN}}$, which are applied to nodes A and B, respectively, can be provided by an external oscillator. Although there are numerous possible arrangements for generating these complementary signals, it is assumed for purpose of illustration in FIG. 3 that a generator, not shown, produces a clock signal $\phi_o$. This is applied to the $\overline{\phi_{IN}}$ driver 30, a conventional bootstrap inverter, which produces $\overline{\phi_{IN}}$ at node B. In addition, $\overline{\phi_{IN}}$ is used to drive another inverter, the $\overline{\phi_{IN}}$ driver 40, which produces $\phi_{IN}$ for application to node A. As is shown, by way of example, MOSFETs Q1, Q2, and Q3, and capacitor C1 form the bootstrap inverter which is the driver 30.

In addition to logically inverting $\phi_o$ to create $\overline{\phi_{IN}}$, this driver circuit also establishes the two levels of the $\overline{\phi_{IN}}$ pulse train. In general, these levels are referred to as high and low. For p-channel MOSFET circuits, $V_{ss}$, defined as the most positive voltage level supplied to the chip, is the low level; and herein 0 volts has been arbitrarily chosen as this low or reference level. The negative dc supply voltage designated $-V_{DD}$ is the high level. In conformity with these definitions, and the designations used in FIG. 2, negative voltages greater than threshold are herein designated $-V$ and referred to as high voltages and voltages approaching $V_{SS}$ (designated ground) are referred to as low voltages. Accordingly, higher or increasing voltages mean those of increasing magnitude in negative direction. Where bootstrapping is employed $-V$ will, in most cases, be the supply voltage $-V_{DD}$.

The other bootstrap inverter which forms driver 40 consists of MOSFETS Q4, Q5, and Q6 and capacitor C2. It functions identically to produce $\phi_{IN}$ (the complement of $\overline{\phi_{IN}}$) with similar levels of $-V_{DD}$ and ground. Inasmuch as drivers 30 and 40 operate in a conventional manner, no further discussion of their circuitry nor operation is required.

Node B is connected to one input of a push/pull amplifier 41. This amplifier consists of a pull-up to $-V_{DD}$ MOSFET Q9, a pull-down to $V_{SS}$ MOSFET Q10, and capacitor C3. The drain-source paths of MOSFETs Q9 and Q10 are serially connected between a dc supply voltage $-V_{DD}$ and ground and the capacitor C3 connects the intermediate point, node D, to the gate of MOSFET Q9, node C. The gate of Q10 is connected to node B, and when the voltage at node B goes low ($O\overline{\phi_{IN}}$ is zero in FIG. 2A) the path to ground provided by MOSFET Q10 is turned OFF.

Since the voltage at node A is the logical complement of the voltage at node B, this voltage at node A begins to rise when the node B voltage goes low, and the high voltage at node A is transferred to node C under the control of transfer gate 42. This gate 42 consists of a single MOSFET Q7, whose drain-source path connects nodes A and C. Thus the high voltage node A will be transferred to node C if MOSFET Q7 is ON. The state of the MOSFET Q7 is, in turn, determined by the voltage applied to its gate from sensing circuit 43 as will be described hereinafter.

Assuming that Q7 is turned ON, the voltage at node C will start to rise, and since node C is the gate of pull-up MOSFET Q9, Q9 will turn ON, causing the voltage at node D to rise toward $-V_{DD}$. The large capacitance on point D, however, causes it to charge much more slowly than point C, and, thus, as the voltage at point D rises, it boosts up the voltage at node C through capacitor C3 to a level much greater than the supply voltage $-V_{DD}$. The voltage at point D is the first output phase $\phi_1$. Thus, when the voltage at node A is high and simultaneously the gate 42 is conducting the voltage from node A to the amplifier stage 41, (as determined by the output of the sensing circuit 43), a $\phi_1$ pulse will be produced at node D, the output of the amplifier 41.

The other part of the circuit, consisting of a transfer gate 32 (MOSFET Q8), an amplifier 31 (pull-up MOSFET Q11, pull-down MOSFET Q12 and capacitor C4), and a sensing circuit 33, is a duplicate of the part consisting of the elements 42, 41 and 43, and it produces $\phi_2$ at node F in the same way that $\phi_1$ is produced at node D.

Thus, a $\phi_2$ pulse will appear whenever the voltage at node B rises and is gated by transfer gate 32 in response to a feedback signal from sensing circuit 33.

The operation described above for producing $\phi_1$ and $\phi_2$ assumes that transfer gates 42 and 32 are ON. If the gates 42 and 32 are OFF, their respective amplifiers 41 and 31 are OFF and an OFF amplifier produces no output pulse. Of course, gates 42 and 32 are never ON concurrently. When it is on, MOSFET Q7 (gate 42) turns MOSFET Q9 the amplifier 41 ON and OFF in accordance with the voltage at node A; but MOSFET Q9 is never ON concurrently with MOSFET Q10, which discharges (or turns OFF) the amplifier 41 when it is ON. Therefore, no dc power is dissipated when the output of the amplifier 41 is being prevented. MOSFETs Q8, Q11 and Q12 operate similarly for the amplifier 31 in response to the voltage at node B.

MOSFET Q7, which is gate 42, is ON only when the complement of $\phi_2$ is generated by sensing circuit 43 and fed back to the gate of Q7. The primary function of the circuit 43 is to delay the feedback signal from the output of the amplifier 31 to the gate 42 by a fixed amount and in addition, a logical inversion. A suitable configuration of the sensing circuit 43 therefore consists of three series-connected bootstrap inverters, but the use of bootstrap stages is a matter of design choice and is purely optional, MOSFETs Q22, Q23, and Q24, along with capacitor C8, form the first inverter stage; MOSFETs Q25, Q26, and Q27 and capacitor C9 form the second inverter stage; and MOSFETs Q28, Q29, and Q30 and capacitor C10 form the last inverter stage. Each inverter is the same and therefore only a description of the first stage will be presented as a representative example. In this first inverter, the drain-source path of the input or pull-down MOSFET Q24 is connected between ground and the inverter's output node G. The load MOSFET Q23 has its drain-source path in series with the dc $-V_{DD}$ voltage supply and node G, and capacitor C8 connects node G to the gate of MOSFET 23. The drain-source path of isolating MOSFET 22 connects the gate of MOSFET 23 and the voltage supply, and its gate connection to the same supply insures that it is permanently ON.

The clock phase $\phi_2$ is produced at the output (node F) of amplifier 31. If the $\phi_2$ signal is high it will cause node G to be grounded through MOSFET Q24 which is turned ON by the high state at node F (its gate). If $\phi_2$ is low, it will cause node G to go high since the path from node G to ground will be opened and node G will be charged by the bootstrapped MOSFET Q23. Thus, the voltage at node G will be a logical inversion of the voltage at node F.

The second and third inverter stages operate in the same manner and the signal at node G is, in turn, inverted to produce its complement at node H, and this is inverted by the last stage to produce its complement at node I. This signal, which is designated $\phi_{S1}$ and is the logical inversion of the signal $\phi_2$ at node F, is fed back to the gate of the MOSFET Q7.

However, $\phi_{S1}$ is delayed by the sensing circuit 43 and its specific characteristics such as rise and fall times are affected by the parameters of the circuit 43. In particular, the time $t_{2-1}$ is controlled by the delay in the feedback path from node F to gate 42, and the size (length of the channel) of the load MOSFET Q23 is the principal element affecting the delay since an inverter's speed of output transition from a reference state to a high state is inversely related to the channel length of the load MOSFET. It is noted that if only spacing between clock phases is required, a single inverter will suffice for the sensing circuit 43. However, a series connection of any odd number of stages will provide an inverted output, and using at least three stages offers advantages over the single stage arrangement.

For example, increasing the delay time $t_{2-1}$ (increasing the length of MOSFET Q23) slows the rise time $t_{r1}$ of $\phi_{S1}$ and hence $\phi_1$, and since it is desirable for the rise time to be as fast as possible for a given delay, additional inverter stages provide means for obtaining independent control of the rise time. Where three inverter stages are used, as shown, the load MOSFET Q23 can be used to establish delay, and the third stage load MOSFET Q29 can be used to establish rise time $t_{r1}$. The specific delay and rise characteristics desired will, of course, determine the specific sizes required and the techniques for making this determination for a specific circuit are well known to those skilled in the art of MOSFET circuit design.

The sensing circuit 33 is identical to the sensing circuit 43. MOSFETs Q13, Q14, and Q15, along with capacitor C5, form its first stage; MOSFETs Q16, Q17, and Q18 and capacitor C6 form the second stage; and MOSFETs Q19, Q20, and Q21 and capacitor C7 form the last stage. Accordingly, its parameters may be selected to control the delay time $t_{1-2}$ (basically the size of MOSFET Q14) and rise time $t_{r2}$ (basically the size of MOSFET Q20) as in the case of the sensing circuit 43. These size selections may, of course, be different than those made for the sensing circuit 43 and thus the delay between $\phi_1$ and $\phi_2$ ($t_{1-2}$) can be made different from the delay between $\phi_2$ and $\phi_1$ ($t_{2-1}$). Similarly, the rise times for $\phi_1$ and $\phi_2$ may be individually selected.

The fall times of the output clock phases $\phi_1$ and $\phi_2$ are not essentially affected by the feedback signal; they are functions of the input signals applied to nodes A and B and of, the size of the pull-down MOSFETs of the amplifiers, such as MOSFETs Q10 and Q12, respectively, to which nodes A and B are directly connected.

Utilizing the circuit of FIG. 3, a complete set of controls, therefore, exists for spacing and shaping the $\phi_1$ and $\phi_2$ clock pulses. Of course if shaping is not desired, the sensing circuits can be reduced to a single inverter for providing only the desired separation. In summary, the transfer gate (such as 42) will not be turned ON, and hence a pulse associated with its clock phase ($\phi_1$) will not be produced, until the other clock phase ($\phi_2$) has gone low and a specified delay ($t_{2-1}$) has passed.

Figure 4:
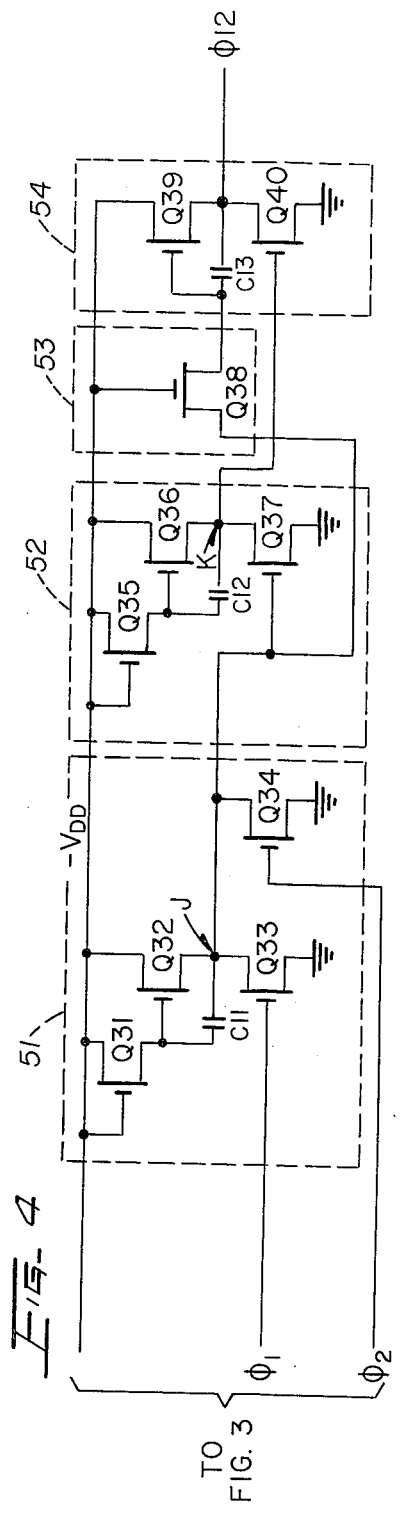
FIG. 4 is a schematic diagram showing an intermediate clock phase circuit suitable for use with the two phase clock circuit of FIG. 3.
Figure 5:
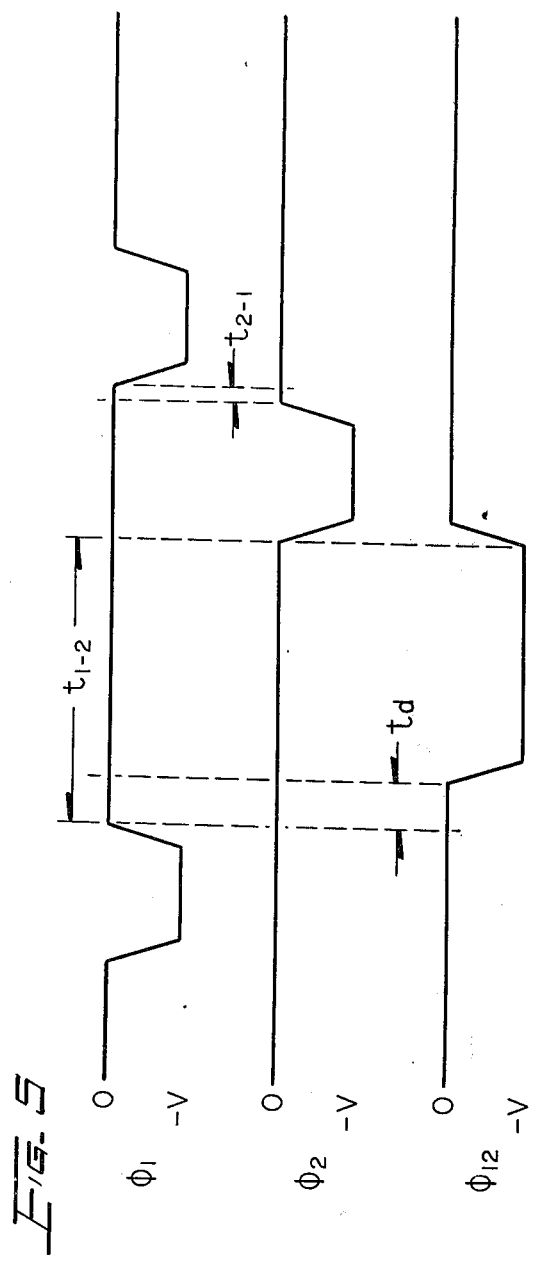
FIG. 5 is a timing diagram helpful in describing the operation of the circuit of FIG. 4.

If the circuit of FIG. 3 is adjusted so that either $t_{1-2}$ or $t_{2-1}$ is large, and the other very small, an additional clock phase can be generated in the gap between the pulses of the principal clock phases $\phi_1$ and $\phi_2$. FIG. 4 illustrates a schematic diagram of a circuit which generates a third clock phase between the end of the $\phi_1$ clock phase pulse and the beginning of the $\phi_2$ clock phase pulse, and is therefore designated $\phi_{12}$. This circuit is appended to the circuit of FIG. 3 and will produce the $\phi_{12}$ clock pulse, as shown in FIG. 5, if the $t_{12}$ interval is larger than the pulse width of $\phi_{12}$ and the $t_{2-1}$ interval is shorter than the total delay $t_d$ of the FIG. 4 circuit.

The dc supply voltage $-V_{DD}$ and the $\phi_1$ and $\phi_2$ outputs of FIG. 3 are connected as indicated. The $\phi_1$ and $\phi_2$ clock phases are applied to a conventional bootstrap NOR-gate 51, shown as consisting of two individual pulldown or input MOSFETs Q33 and Q34, whose source-drain paths are connected in parallel between ground and a common node J, and a load MOSFET Q32 whose source-drain path is connected between supply voltage $-V_{DD}$ and this node J; the gate voltage of the load MOSFET Q32 is provided by MOSFET Q31, which is biased to be permanently ON and by the bootstrap effect of capacitor C11 which connects the node J to the gate. The $\phi_1$ clock phase is applied to the gate of MOSFET Q33 and the $\phi_2$ clock phase is connected to the gate of MOSFET Q34. Since a high input to either MOSFET Q33 or MOSFET Q34 will cause the voltage at node J to go to ground, the gate circuit 51 detects when $\phi_1$ and $\phi_2$ are both simultaneously OFF, and only in this event does a high voltage ($-V_{DD}$) appear at node J.

A bootstrap inverter 52 consists of MOSFETs Q35, Q36, Q37 and capacitor C12. It is identical in structure and function to the inverters in FIG. 3 and it produces at node K the logical complement of the voltage at node J. Hence when both $\phi_1$ and $\phi_2$ are OFF (that is, no pulse exists) the voltage at node K will be low. The complementary voltages at nodes J and K correspond to the voltages at nodes A and B in FIG. 3, and the $\phi_{12}$ intermediate clock phase is produced by a push-pull amplifier 54 substantially as are the primary clock phases described hereinbefore. The voltage at node K is passed by transfer gate 53 (shown as MOSFET Q38 which is biased permanently ON) to one input of the amplifier 54 and the complementary voltage at node J is coupled directly to the other input of the amplifier 54. The amplifier 54 (MOSFETs Q39 and Q40 and capacitor C13) corresponds in structure and function to amplifiers 41 and 31 and except for the input to the gate of MOSFET Q38, gate 53 is similar to gates 42 and 32.

Of course the delay $t_{1-2}$, between the $\phi_1$ and $\phi_2$ clock phases can be made small and the delay, $t_{2-1}$, between the $\phi_2$ and $\phi_1$ can be made large by appropriate adjustment of the parameters in FIG. 3. This would produce a clock phase $\phi_{21}$ between the end of the $\phi_2$ clock phase and the beginning of the $\phi_1$ clock phase. In addition, if neither $t_{1-2}$ nor $t_{2-1}$ were short, the circuit of FIG. 4 would produce an intermediate clock phase which contains pulses in the two gaps between the $\phi_1$ and $\phi_2$ primary clock phases.

The gate 53 in FIG. 4 could also be controlled by a delayed feedback signal and thus the spacing between the preceding primary clock phase, such as $\phi_1$, and the intermediate clock phase, such as $\phi_{12}$, would be adjustable. In addition, if appropriate logic and feedback were provided, the $\phi_1$ and $\phi_2$ primary clock phases could be used to generate two intermediate clock phases with independent spacing of these intermediate clock phases within the gaps between the pulses of $\phi_1$ and $\phi_2$ and between the pulses of $\phi_2$ and $\phi_1$, respectively. Theoretically, it is possible to generate any number of intermediate and subintermediate clock phases if adequate spacing is provided between adjacent pulses of preexisting clock phases. In all cases, of course, the spacing would have to be greater than the pulse width of the pulse being inserted.

In all cases it is to be understood that the above described arrangements are merely illustrative of a small number of the many possible applications of the principles of the present invention. Numerous and varied other arrangements in accordance with these principles may readily be devised by those skilled in the art without departing from the spirit and scope of the invention.

What is claimed:

1. A multiple-phase clock generator circuit for providing at least two clock phases, each consisting of an individual pulse train comprising:

means for producing a first input pulse train at a first node and a second input pulse train at a second node, the first and second input pulse trains being complementary;

first amplifier means for producing one of the clock phases;

first connection means for coupling the first and second nodes to the first amplifier means;

the first amplifier means being turned on to start a pulse of the one clock phase when a pulse from the first input pulse train is coupled to the first amplifier means, and the first amplifier means being turned off to end the pulse of the one clock phase when a pulse from the second input pulse train is coupled to the first amplifier means;

second amplifier means for producing another of the clock phases;

second connection means for coupling the first and second nodes to the second amplifier means;

the second amplifier means being turned on to start a pulse of the other clock phase when a pulse from the second input pulse train is coupled to the second amplifier means, and the second amplifier means being turned off to end the pulse of the other clock phase when a pulse from the first input pulse train is coupled to the second amplifier means;

feedback means for producing from the other clock phase at the output of the second amplifier means, a first control pulse train whose pulses are delayed by a first selected time from the end of the corresponding pulses of the other clock phase; and said first connection means including means responsive to the control pulse train for coupling the first input pulse train at the first node to the first amplifier means only during the occurrence of the pulse of the first control pulse train;

whereby a pulse of the one clock phase will begin only the first preselected time after a pulse of the other clock phase has ended.

2. A multiple-phase clock generator circuit as claimed in claim 1 further comprising second feedback means for producing from the one clock phase at the output of the first amplifier means a second control pulse train whose pulses are delayed by a second selected time from the end of the corresponding pulses of the one clock phase; and said second connecting means including means responsive to the second control pulse train for coupling the second input pulse train at the second node to the second amplifier means only during the occurrence of a pulse of the second control pulse train;

whereby a pulse of the other clock phase will begin only the second preselected time after a pulse of the one clock phase has ended.

3. A multiple-phase clock generator circuit as claimed in claim 2 wherein the first and second selected times in the first and second feedback means are different from one another.

4. A multiple-phase clock generator circuit as claimed in claim 1 further comprising an auxiliary amplifier means for producing a third clock phase pulse train, the pulses of the third clock phase occurring only during the intervals between the end of a pulse of one of the clock phases and the beginning of the pulse of the other of the clock phases.

5. A multiple-phase clock generator circuit as claimed in claim 1 wherein the feedback means includes an odd number of inverter stages as the means for providing the first selected time delay.

6. A multiple-phase clock generator circuit as claimed in claim 5 wherein the feedback means includes a series connection of at least three inverter stages and the parameters of the inverter stages are chosen to provide the first selected time delay and also a selected rise time of the first control pulse train.

7. A multiple-phase clock generator circuit as claimed in claim 1 wherein the first amplifier means is a push/pull amplifier having first and second inputs, the first node being connected to the first input and the second node being connected to the second input.

8. A multiple-phase clock generator circuit as claimed in claim 7 wherein the first connection means includes a transistor switch having two controlled electrodes, one controlled electrode being connected to the first node and the other controlled electrode being connected to the first input of the first amplifier means and a control electrode connected to the feedback means.

9. A multiple-phase clock generator circuit as claimed in claim 8 wherein the transistor switch means is a field-effect transistor of the metal-oxide-semiconductor type having its gate electrode connected to the feedback means and its drain-source path connected between the first node and the first input of the first amplifier means.

10. A multiple phase clock generator circuit for producing at least two clock phases of the type having:

an oscillator source means, having first and second nodes, for producing complementary pulse trains at said first and second nodes, respectively;

first and second amplifier means for producing one of said clock phases at the output of each said amplifier means, the clock phases being pulse trains, the pulses of each being produced at the output of the respective amplifier means in response to an enabling indication applied to its input;

first coupling means for connecting said first node to said first amplifier means, a specified level of the pulse train at the first node being coupled as the enabling indication to the first amplifier means;

said first coupling means including first feedback means connected to the output of the second amplifier means to disable the coupling of the enabling indication to the first amplifier means in response to a specified level of the clock phase at the output of the second amplifier means;

characterized in that:

the first coupling means further includes a direct and permanent connection between the second node and the first amplifier means, said direct connection providing a discharge path from the output of the first amplifier means in response to a specified level of the pulse train at the second node; and the first feedback means includes adjustable means for delaying the feedback signal from the output of the second amplifier means so that the coupling of the enabling indication to the first amplifier means is possible only a first selected time interval after the clock phase at the output of the second amplifier means goes from a first specified level to a second specified level;

whereby a defined time separation is provided between a pulse of one of the clock phases at the output of the second amplifier means and a succeeding pulse of the other clock phase at the output of the first amplifier means.

11. A multiple phase clock generator circuit as claimed in claim 10 further comprising, second coupling means connecting said second node to said second amplifier means, a specified level of the pulse train at the second node being coupled as the enabling indication to the second amplifier means;
second feedback means for disabling the coupling of the enabling indication to the second amplifier means in response to a specified level of the clock phase at the output of the first amplifier means; and
the second feedback means including adjustable means for delaying the feedback signal from the output of the first amplifier means so that the coupling of the enabling indication to the second amplifier means is possible only a second selected time interval after the clock phase of the output of the first amplifier means goes from a first specified level to a second specified level.

12. A multiple phase clock generator circuit as claimed in claim 11, wherein the first and second amplifiers are push/pull amplifiers having first and second inputs;
the first coupling means includes a transistor switch for disabling the coupling of the enabling indication to the first amplifier means; and
the second coupling means includes a transistor switch for disabling the coupling of the enabling indication to the second amplifier means;
the transistor switch of the first coupling means having two controlled electrodes, one being connected to the first node and the other being connected to the first input of the first amplifier, and a control electrode connected to the first feedback means;
the transistor switch of the second coupling means having two controlled electrodes, one being connected to the second node and the other being connected to the first input of the second amplifier, and a control electrode connected to the second feedback means.

13. A multiple phase clock generator circuit as claimed in claim 11 wherein the first and second selected time intervals are different from one another.

14. A multiple phase clock generator circuit as claimed in claim 10 further comprising an auxiliary amplifier means for producing a third clock phase pulse train, the pulses of the third clock phase occurring only during the intervals between the end of the pulse of one of the clock phases and the beginning of the pulse of the other of the clock phases.

15. A multiple phase clock generator circuit as claimed in claim 10 wherein the first feedback means includes an odd number of inverter stages.

16. A multiple phase clock generator circuit as claimed in claim 10 wherein the direct connection to the first amplifier means causes the first amplifier means to turn OFF, and wherein the disablable coupling to the first amplifier means causes the first amplifier means to turn ON.

17. A multiple phase clock generator circuit for producing at least two spaced apart clock phases comprising:
means for generating an input pulse train and a complementary pulse train which is a logical complement of the input pulse train;
a first amplifier and a second amplifier, each having two inputs and each producing one of the clock phases at its output;
first conductive means for directly coupling the complementary pulse train to one input of the first amplifier;
second conductive means for directly coupling the input pulse train to one input of the second amplifier;
first gating means for applying the input pulse train to the second input of the first amplifier in response to a first control signal;
second gating means for applying the complementary pulse train to a second input of the second amplifier in response to a second control signal;
first feedback means for monitoring the output of the first amplifier and producing the second control signal to which the second gating means responds, said first feedback means including means for delaying the output of the first amplifier; and
second feedback means for monitoring the output of the second amplifier and providing the first control signal to which the first gating means responds, said second feedback means including means for delaying the output of the second amplifier;
whereby specified spacings are provided between the pulses of one of the clock phases and the pulses of the other of the clock phases.

18. A multiple phase clock generator as claimed in claim 17 further including means responsive to the two clock phases for producing an intermediate clock phase in the time between the end of the pulse of one of the clock phases and the beginning of the pulse of the other of the clock phases, said intermediate clock phase producing means including means for monitoring when the pulses of both the one and the other clock phases are off, and means operative only when the one and the other clock pulses are off for producing a third clock phase intermediate to the two clock phases.

* * * * *